(12) United States Patent
Mittal et al.

(10) Patent No.: US 11,921,259 B2
(45) Date of Patent: Mar. 5, 2024

(54) OLEOPHOBIC COATINGS FOR GLASS STRUCTURES IN ELECTRONIC DEVICES

(71) Applicant: Apple Inc., Cupertino, CA (US)

(72) Inventors: Manish Mittal, San Jose, CA (US); Feng Liu, Sunnyvale, CA (US); Kenji Ishizeki, Yokohama (JP); Matthew S. Rogers, San Jose, CA (US); Naoto Matsuyuki, Kasugai (JP); Wolf Oetting, San Jose, CA (US)

(73) Assignee: Apple Inc., Cupertino, CA (US)

( * ) Notice: Subject to any disclaimer, the term of this patent is extended or adjusted under 35 U.S.C. 154(b) by 807 days.

(21) Appl. No.: 16/843,137

(22) Filed: Apr. 8, 2020

(65) Prior Publication Data

US 2020/0333510 A1    Oct. 22, 2020

Related U.S. Application Data

(60) Provisional application No. 62/835,371, filed on Apr. 17, 2019.

(51) Int. Cl.
*G02B 1/18* (2015.01)
*B05D 1/00* (2006.01)
(Continued)

(52) U.S. Cl.
CPC ............... *G02B 1/18* (2015.01); *B05D 1/36* (2013.01); *B05D 1/60* (2013.01); *B05D 5/083* (2013.01);
(Continued)

(58) Field of Classification Search
CPC ... G02B 1/18; B05D 1/36; B05D 1/60; B05D 5/083; C03C 17/42; C03C 2217/176;
(Continued)

(56) References Cited

U.S. PATENT DOCUMENTS 10,023,751 B2   7/2018   Hu et al.
10,400,136 B2   9/2019   Dustin et al.
(Continued)

FOREIGN PATENT DOCUMENTS

CN    103724610 A    4/2014
CN    107698768 A    2/2018
JP    H10120445 A    5/1998

*Primary Examiner* — Brian K Talbot
(74) *Attorney, Agent, or Firm* — Treyz Law Group, P.C.; G. Victor Treyz; David K. Cole

(57) ABSTRACT

An electronic device includes electrical components in a housing. The components may include optical components such as a display. Protective structures may be used to protect the optical components. The protective structures may include one or more protective transparent layers such as layers of glass or crystalline material such as sapphire. The protective transparent layers may be coated with an oleophobic coating. To enhance coating durability, catalyst may be used to help bond the oleophobic coating. An adhesion promotion layer such as a silicon oxide layer may be deposited on the transparent protective layer. A catalyst layer such as a layer of sodium fluoride may be deposited on the adhesion promotion layer. The oleophobic material may be evaporated or otherwise deposited on the catalyst layer. Heat and moisture may help the oleophobic material form chemical bonds with the adhesion promotion layer, thereby forming a durable oleophobic coating.

14 Claims, 6 Drawing Sheets

(51) Int. Cl.
*B05D 1/36* (2006.01)
*B05D 5/08* (2006.01)
*C03C 17/42* (2006.01)
*C23C 14/00* (2006.01)
*H05K 5/00* (2006.01)
*H05K 5/03* (2006.01)
*C23C 14/02* (2006.01)
*C23C 14/10* (2006.01)
*C23C 14/14* (2006.01)
*C23C 14/58* (2006.01)

(52) U.S. Cl.
CPC ............. *C03C 17/42* (2013.01); *C23C 14/00* (2013.01); *H05K 5/0017* (2013.01); *H05K 5/03* (2013.01); *B05D 2203/35* (2013.01); *C03C 2217/76* (2013.01); *C03C 2218/15* (2013.01); *C03C 2218/31* (2013.01); *C03C 2218/32* (2013.01); *C23C 14/021* (2013.01); *C23C 14/024* (2013.01); *C23C 14/10* (2013.01); *C23C 14/14* (2013.01); *C23C 14/58* (2013.01); *H05K 2203/1333* (2013.01)

(58) Field of Classification Search
CPC .... C03C 2217/221815; C03C 2217/31; C03C 2217/32; H05K 5/0017; H05K 5/03; H05K 2203/1333; C23C 14/021; C23C 14/024; C23C 14/10; C23C 14/14; C23C 14/58

USPC ...................................................... 427/255.7
See application file for complete search history.

(56) References Cited

U.S. PATENT DOCUMENTS

| | | |
|---|---|---|
| 10,413,948 B2 | 9/2019 | Bellman et al. |
| 10,442,935 B2 | 10/2019 | Nelson et al. |
| 10,569,506 B2 | 2/2020 | Jin et al. |
| 2006/0078717 A1* | 4/2006 | Yamaya ................. C08G 77/50 428/212 |
| 2006/0110537 A1 | 5/2006 | Huang et al. |
| 2007/0020392 A1* | 1/2007 | Kobrin ................. C03C 23/006 427/532 |
| 2009/0197048 A1 | 8/2009 | Amin et al. |
| 2012/0292256 A1* | 11/2012 | Yuan ..................... C04B 41/009 210/671 |
| 2017/0233287 A1* | 8/2017 | Li ........................... C03C 3/068 428/172 |
| 2017/0367192 A1* | 12/2017 | Lee ........................ H05K 3/285 |
| 2018/0127308 A1 | 5/2018 | Leivo et al. |
| 2019/0324566 A1 | 10/2019 | Virgili et al. |
| 2020/0024478 A1* | 1/2020 | Liang ................. C03C 23/0075 |
| 2020/0048459 A1 | 2/2020 | Rabnawaz |
| 2020/0071838 A1* | 3/2020 | Tryon ..................... C23C 28/34 |

* cited by examiner

OLEOPHOBIC COATINGS FOR GLASS STRUCTURES IN ELECTRONIC DEVICES

This application claims the benefit of provisional patent application No. 62/835,371, filed Apr. 17, 2019, which is hereby incorporated by reference herein in its entirety.

BACKGROUND

This relates generally to coatings, and, more particularly, to coatings for glass structures in electronic devices.

Electronic devices such as cellular telephones, computers, watches, and other devices may contain layers of glass or other transparent material. For example, electronic devices may have displays and camera windows that are covered with protective layers of transparent material.

The inclusion of transparent protective layers may help prevent damage to electrical components such as display and camera components, but such layers may pick up fingerprints. To provide a transparent protective layer with anti-smudge properties, an oleophobic coating layer can be added to the outer surface of the protective layer. Oleophobic coating layers help reduce smudging from finger contact, but can be vulnerable to scratching.

SUMMARY

An electronic device may include a housing. Electrical components may be mounted in within an interior region of the housing. The electrical components may include optical components such as a display, optical sensors, and/or other components that emit and/or detect light.

Protective structures may be used to protect the optical components. The protective structures may include one or more protective transparent layers. Protective transparent layers may be formed from glass or crystalline materials such as sapphire.

To prevent fingerprint smudging, the protective transparent layers may be coated with an oleophobic coating. To enhance coating durability, catalyst may be used to help bond the oleophobic coating. During coating formation, an adhesion promotion layer such as a silicon oxide layer may be deposited on the transparent protective layer. A catalyst layer such as a layer of sodium fluoride may be deposited on the adhesion promotion layer. The oleophobic material may be evaporated or otherwise deposited on the catalyst layer. Heat and moisture may be applied while the evaporated oleophobic material is in the presence of the catalyst layer to help the oleophobic material form chemical bonds with the adhesion promotion layer. This forms a durable transparent oleophobic coating.

DETAILED DESCRIPTION

Electronic devices and other items may be provided with optical components. These optical components may include displays and optical sensors. For example, an electronic device may include a display on a front face of the device. The display may have an array of pixels for displaying images for a user. To protect the pixel array from damage, the display may be covered with a transparent protective layer such as a layer of glass, sapphire, or other transparent material that serves as a display cover layer. Other portions of electronic devices may also include transparent protective structures. For example, a transparent protective layer may form a camera window. Transparent protective layers may also overlap status indicator lights, proximity sensors, ambient light sensors, and other optical components. If desired, layers of glass, crystalline material such as sapphire, or other transparent material may be used in forming electronic device housing structures (e.g., a rear housing wall, sidewall structures, etc.).

To prevent smudging from fingerprints, a transparent protective layer or other structure formed from glass, sapphire, or other crystalline materials in an electronic device may be covered with an oleophobic coating. The oleophobic coating may be formed from a fluoropolymer or other material that has oleophobic properties. To ensure that the oleophobic coating is durable, the oleophobic coating may be applied using a catalyst that promotes bonding between the oleophobic coating and an adhesion layer on the surface of the transparent protective layer.

In general, any electronic device structures may be covered with oleophobic coatings. These structures may include structures formed from glass, sapphire or other crystalline materials, transparent ceramic, polymer, and/or other materials. The oleophobic coatings may include one or more thin-film layers. These layer(s) may include dielectric materials (e.g., polymer, inorganic dielectrics such as oxides, carbides, nitrides, etc.), metals, and/or semiconductors. Illustrative arrangements in which thin-film layers are used for forming an oleophobic coating on a transparent protective layer such as a layer of glass or a layer of crystalline material such as sapphire may sometimes be described herein as an example. The transparent protective layer may cover a display, may serve as a camera window, or may overlap other optical components.

Figure 1:
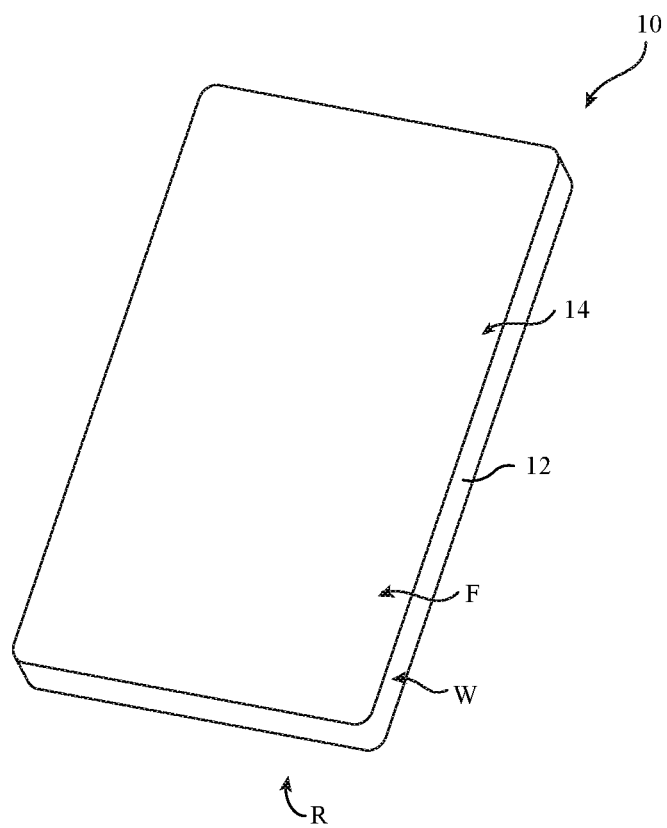
FIG. 1 is a perspective view of an illustrative electronic device of the type that may include a transparent protective layer with a coating in accordance with an embodiment.

An illustrative electronic device of the type that may include transparent protective structures is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device (e.g., a wristwatch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14. Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of pixels formed from liquid crystal display (LCD) components, an array of electrophoretic pixels, an array of plasma pixels, an array of organic light-emitting diode pixels or other light-emitting diodes such as light-emitting diodes formed from crystalline semiconductor dies, an array of electrowetting pixels, or pixels based on other display technologies. For example, display 14 may be an organic light-emitting diode display or a liquid crystal display.

Device 10 may have a housing such as housing 12. Housing 12, which may sometimes be referred to as an enclosure or case, may be formed of plastic, glass, ceramics, fiber composites, metal (e.g., stainless steel, aluminum, titanium, gold, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Electrical components (e.g., a pixel array for display 14, optical sensors, other optical components, integrated circuits, a battery, etc.) may be mounted in an interior region within housing 12.

Housing 12 or structures coupled to housing 12 may include one or more transparent portions. For example, a portion of housing 12 may be formed from a layer of transparent material such as glass or a layer of transparent material such as sapphire or other crystalline material that serves as a display cover layer. The display cover layer may cover and protect the pixels of display 14 and other overlapped optical components (e.g., a proximity sensor, ambient light sensor, camera flash, three-dimensional sensor, time-of-flight sensor, digital image sensor, etc.). Display 14 and the transparent protective layer that overlaps display 14 (and, if desired, that overlaps other optical components such as optical sensors) may be formed on front face F of device 10 or other portion of device 10.

Other structures in device 10 may also be formed from transparent material. For example, portions of housing 12 on rear face R and/or portions of housing 12 forming a sidewall W that extends between the portion of housing 12 on front face F and the portion of housing 12 on rear face R may be formed from glass or crystalline material such as sapphire. Transparent structures in device 10 such as glass or sapphire portions of housing 12 may include planar layers and transparent members with non-planar shapes such as shapes with curved cross-sectional profiles, transparent layers with bends along the peripheral edges of device 10, glass window structures for cameras and other optical components, and/or other glass members with planar and/or curved shapes.

Figure 2:
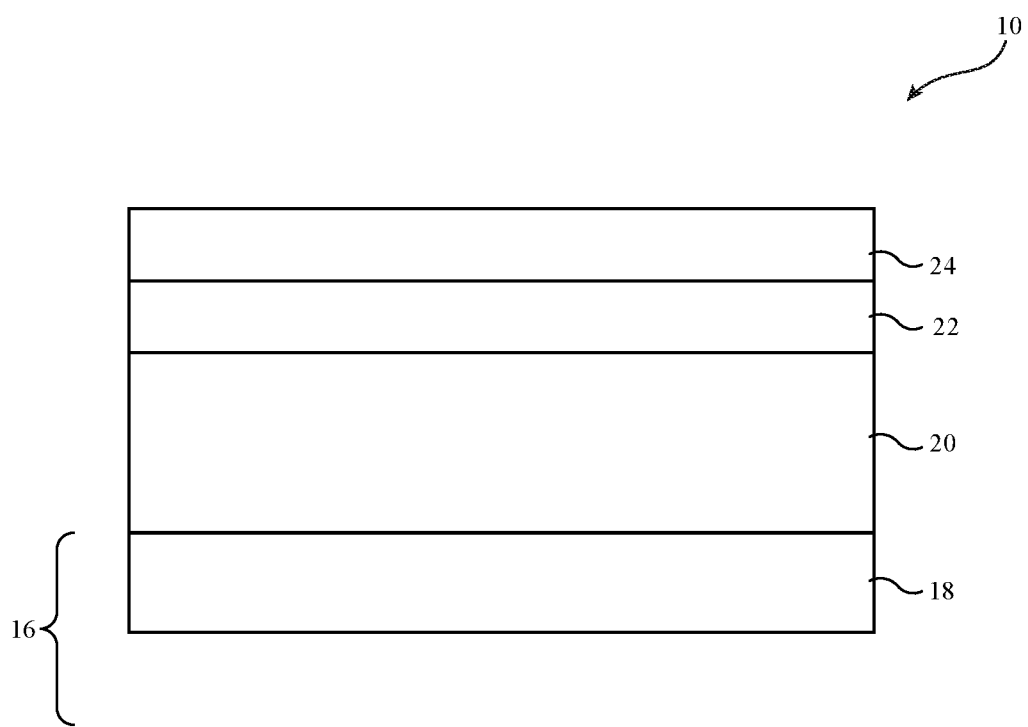
FIG. 2 is a cross-sectional side view of a portion of an electronic device with an electrical component covered with a transparent protective layer with a coating in accordance with an embodiment.

FIG. 2 is a cross-sectional side view of a portion of an illustrative device such as device 10 of FIG. 1 that contains transparent structures. As shown in FIG. 2, device 10 may have optical components such as component 18 mounted within interior region 16 of device 10. Component 18 may be a display (e.g., a pixel array), a proximity sensor that emits and detects light, an image sensor (e.g., a visible light and/or an infrared camera), a three-dimensional image sensor, an ambient light sensor, a status indicator light, a camera flash, and/or other component that emits and/or detects light. Component 18 may be formed in an interior region within device 10 (e.g., in interior region 16 inside housing 12 of FIG. 1). Housing 12 may include, for example, rear wall structures, sidewalls, and/or front housing wall portions (e.g., a display cover layer for a display). Transparent portions of housing 12 (e.g., a display cover layer), camera window structures, and other transparent protective structures in device 10 are illustrated as transparent protective layer (structure) 20 of FIG. 2.

As shown in FIG. 2, transparent protective layer 20 may be covered by an adhesion promotion layer such as adhesion promotion layer 22. Layer 22 may, for example, be a thin-film layer such as a silicon oxide thin-film layer. Oleophobic coating 24 may be formed from a polymer layer that is chemically bonded to layer 22. The use of silicon oxide in forming layer 22 may help layer 22 adhere well to transparent protective layer 20 and may promote adhesion of oleophobic coating 24 to layer 22 (and thereby layer 20). Oleophobic layer 24 may be an oleophobic polymer layer such as a fluoropolymer layer.

Transparent protective layer 20 may have a thickness of at least 100 µm, at least 0.5 mm, at least 1 mm, at least 2 mm, less than 4 mm, less than 3 mm, or other suitable thickness. Adhesion promotion layer 22 may have a thickness of about 2-10 nm, 5 nm, 5-10 nm, at least 0.005 µm, at least 0.01 µm, at least 0.05 µm, less than 0.3 µm, less than 0.1 µm, or other suitable thickness. Oleophobic layer 24 may have a thickness of 2-100 nm, at least 0.005 µm, at least 0.01 µm, at least 0.1 µm, at least 1 µm, less than 5 µm, less than 2 µm, less than 0.7 µm, less than 0.3 µm, or other suitable thickness.

Figure 3:
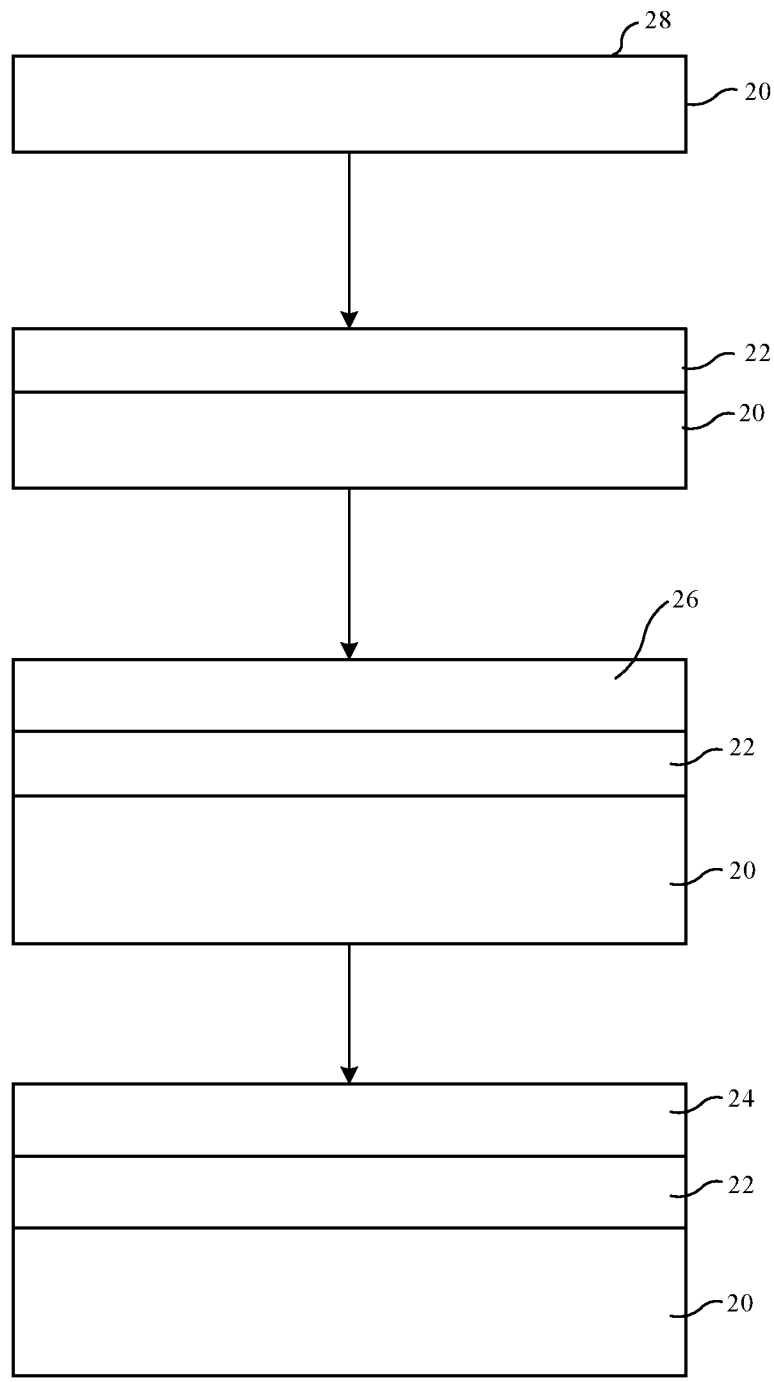
FIG. 3 is a diagram showing how an oleophobic coating layer may be formed in accordance with an embodiment.

Oleophobic coating 24 may help resist fingerprints as a user touches the outer surface of device 10, thereby preventing smudges on protective transparent layer 20. FIG. 3 illustrates a process for forming oleophobic layer 24. At the top of FIG. 3, substrate 20 is shown after a cleaning process has been performed on upper (outermost) surface 28. After surface 28 is cleaned, adhesion promotion layer 22 may be deposited as shown in the second-from-top portion of FIG. 3. Catalyst layer 26 may then be formed on layer 22 as shown in the third-from-top portion of FIG. 3. With an illustrative arrangement, layer 20 is glass or a crystalline material such as sapphire. Adhesion promotion layer 22 is a thin-film dielectric layer such as a layer of silicon oxide that promotes polymer adhesion to layer 20. Catalyst layer 26 is a material that catalyzes bond formation between oleophobic coating 24 and adhesion promotion layer 22. As shown at the bottom of FIG. 3, the presence of catalyst layer 26 helps promote bond formation and enhances adhesion of oleophobic coating 24 to adhesion promotion layer 22, thereby helping to attach oleophobic coating 24 to layer 22 and underlying transparent protective layer 20. With an illustrative configuration, oleophobic layer 26 is a fluoropolymer and layer 26 is sodium fluoride.

Figure 4:
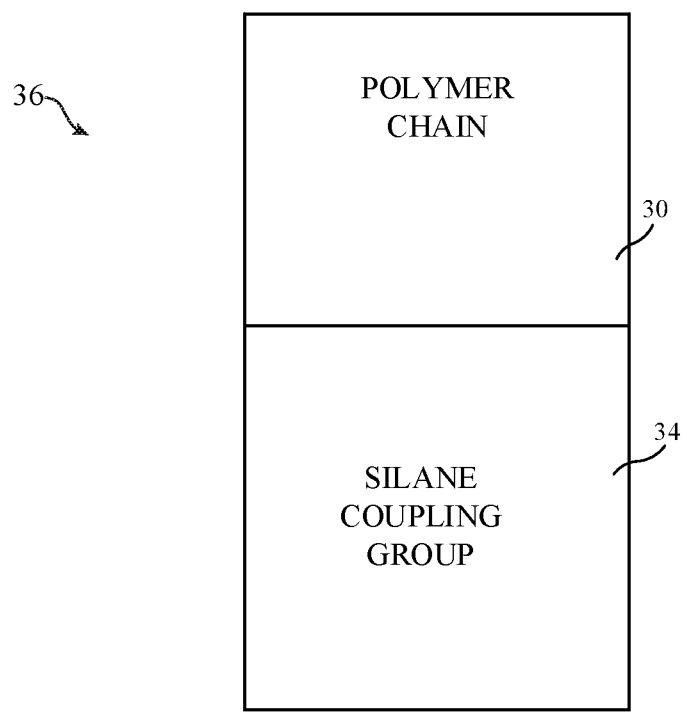
FIG. 4 is a schematic diagram of an illustrative oleophobic material in accordance with an embodiment.
Figure 5:
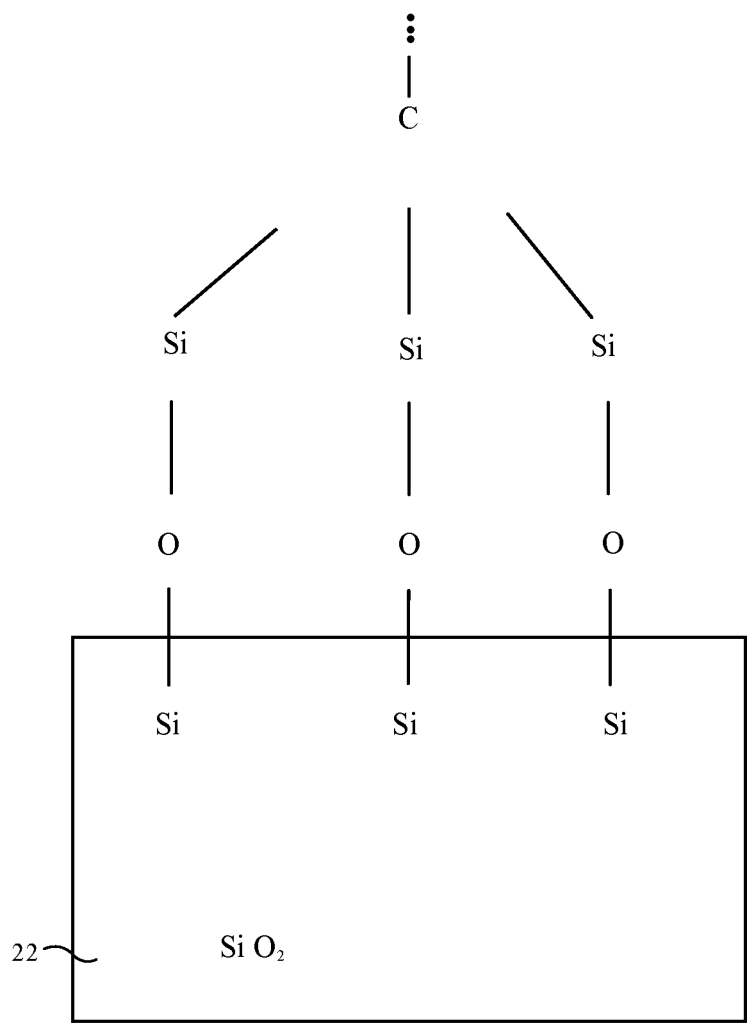
FIG. 5 is a chemical diagram showing how oleophobic material may bond to an adhesion layer in accordance with an embodiment.

FIG. 4 is a schematic diagram of oleophobic polymer material for forming layer 24. As shown in FIG. 4, oleophobic material 36 may include oleophobic polymer chain 30 and a coupling group such as coupling group 34 (e.g., a silane coupling group). Coupling group 34 is formed at the end of polymer chain 30 and helps attach oleophobic polymer material 32 to transparent protective layer 20. Oleophobic polymer chain 30 may be a fluoropolymer chain. Initially, coupling group 34 has oxygen atoms terminated by methyl groups. In the presence of moisture and heat and exposure to the surface of layer 22 and in the presence of sodium fluoride or other catalyst 26 on layer 22, the methyl groups are replaced by hydroxyl groups and begin to bond with hydroxyl groups from layer 22. Eventually, water (a pair of hydrogen atoms and an oxygen atom) is released from each OH—OH group, forming Si—O—Si chemical bonding as shown in FIG. 5. In this way, the silane coupling group (and thereby polymer chain 30 of oleophobic material 36) are chemically bonded to adhesion promotion layer 22, as shown in FIG. 5. In particular, most or all of the silicon atoms from coupling group 34 are bonded by respective oxygen atoms to corresponding silicon atoms in silicon oxide adhesion promotion layer 22, which chemically bonds oleophobic material 36 to the material of layer 22. As a result, oleophobic coating 24 is securely attached to adhesion promotion layer 22 and will be more resistant to wear than oleophobic coatings that are formed on layer 22 in the absence of catalyst layer 26.

Figure 6:
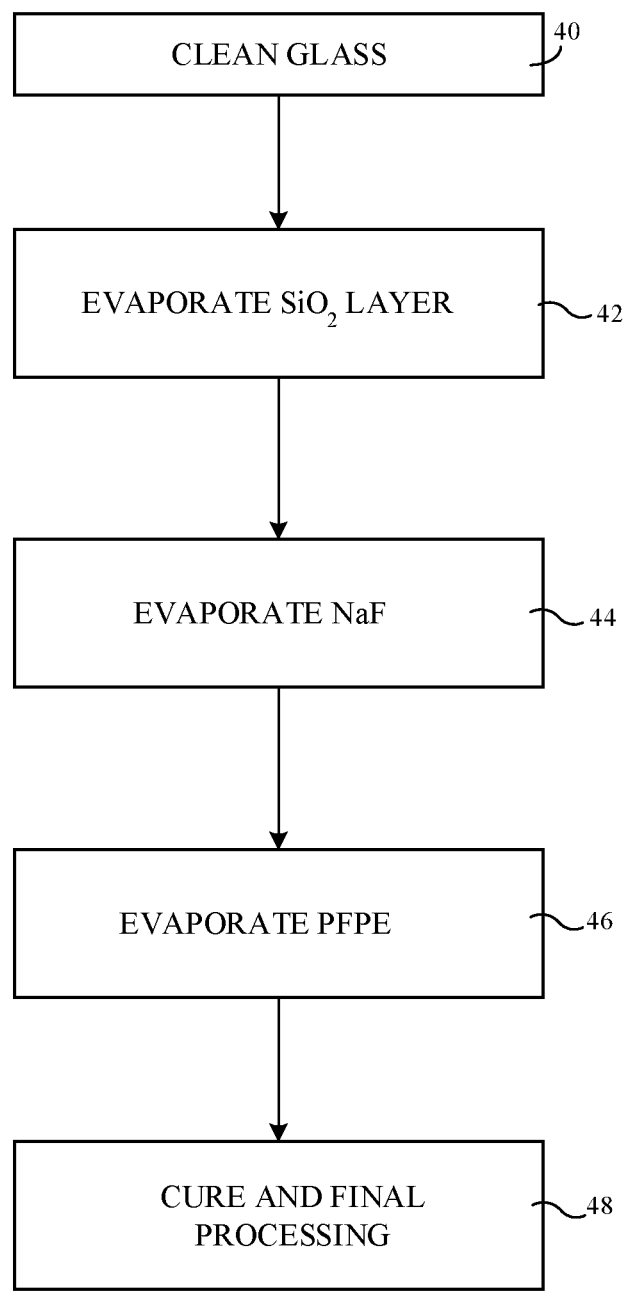
FIG. 6 is a flow chart of illustrative operations associated with forming an oleophobic coating in accordance with an embodiment.

Illustrative operations involved in forming oleophobic coating 24 are shown in FIG. 6.

During the operations of block 40, transparent protective layer 20 is cleaned. For example, a glass layer or a layer of crystalline material such as sapphire is mechanically and chemically cleaned followed by surface treatment (e.g., ion beam surface treatment) to activate surface free radicals.

After cleaning, adhesion promotion layer 22 may be formed the outer surface of layer 20 (and may optionally be cleaned and/or exposed to surface treatment). For example, during the operations of block 42, a layer of silicon oxide may be deposited on the surface of layer 20 by evaporation in a vacuum chamber. The silicon oxide layer may have a thickness of 5-10 nm, at least 1 nm, less than 50 nm, or other suitable thickness.

During the operations of block 44, catalyst layer 26 may be deposited on the exposed surface of layer 22. For example, a layer of sodium fluoride (NaF) of 0.5 nm to 2 nm in thickness or other suitable thickness (e.g., at least 0.1 nm, at least 0.5 nm, at least 1 nm, less than 10 nm, less than 5 nm, etc.) may be evaporated onto layer 22. E-beam evaporation may be used for forming layer 22 and depositing catalyst layer 26 (as an example).

During the operations of bock 46, oleophobic material 36 (e.g., a fluoropolymer such as perfluoropolyether (PFPE)) may be heated in a crucible in a vacuum chamber to evaporate material 36 onto the catalyst-coated surface of layer 22. The vacuum chamber may have a pressure of about $2.5*10^{-2}$ Pa and contains residual moisture. Due to heating from the deposition processes, the temperature of layer 20 and the thin-film structures on layer 20 are raised to about 20-100° C. (e.g., 70° C., 50-100° C., etc.). As described in connection with FIG. 5, the application of heat and moisture causes hydroxyl groups to form on coupling groups 34 and, in the presence of catalyst 26, initiates formation of Si—O—Si bonds between material 36 and adhesion promotion layer 22 as shown in FIG. 5.

Complete bond formation occurs during curing and final processing operations (block 48). The coating layer can be cured 1) at room temperature (e.g., over a period of 5 days), 2) at an elevated temperature produced in the vacuum chamber and/or produced by using a heating tool to raise the temperature of the coating to 140° C. (or at least 100° C., at least 120° C., or other temperature less than 200° C.) for 0.5-24 h, or 3) at 65° C. for 4 h at 90% humidity, or may be cured using other suitable curing arrangements. The curing process in the presence of catalyst from layer 26 completes the formation of a full or nearly full set of Si—O—Si bonds between material 36 and layer 22 and thereby forms a robust chemically bonded oleophobic layer (layer 24 of FIG. 2) on adhesion promotion layer 22.

During curing (e.g., partway through a curing process such as after 5-50 hours of curing), excess catalyst material may be removed. For example, water may be sprayed on the layer of material 36 on layer 22 (e.g., with a mild detergent while polishing off excess portions of material 36 with a cloth pad). This helps remove sodium from catalyst layer 26 and thereby prevents the sodium from reacting with carbon and oxygen to form haze-producing materials (e.g., to help prevent formation of $Na_2CO_3$, which might make the oleophobic coating hazy). Adhesion promotion layer 22 may be free of bulk sodium doping (e.g., layer 22 may be a bulk-sodium-doping-free silicon oxide layer and may therefore contain less than 0.1% sodium by weight, less than 0.01% sodium by weight, and/or other suitable amount of sodium by weight) to help reduce cosmetic defects that might arise when using sodium catalyst in layer 22 instead of layer 26. The spraying and polishing process will generally remove most sodium from layer 26 and will prevent haze in layer 24. In some situations (e.g., when no cleaning operations are performed), a residual amount of sodium may be present after layer 24 is formed. For example, the ratio of Na/Si at the interface between coating 24 and layer 22 may be 0.02-0.5, at least 0.01, less than 0.8, or other suitable amount).

The foregoing is merely illustrative and various modifications can be made to the described embodiments. The foregoing embodiments may be implemented individually or in any combination.

What is claimed is:

1. A method, comprising:
   depositing an adhesion promotion layer onto a protective transparent layer;
   depositing a catalyst layer onto the adhesion promotion layer;
   depositing oleophobic material onto the catalyst layer; and
   curing the oleophobic material to form an oleophobic coating layer that is chemically bonded to the protective transparent layer.

2. The method defined in claim 1 wherein depositing the adhesion promotion layer comprises depositing a silicon oxide layer onto the protective transparent layer.

3. The method defined in claim 2 wherein depositing the catalyst layer comprises depositing a layer of sodium fluoride onto the adhesion promotion layer.

4. The method defined in claim 3 wherein depositing the oleophobic material comprises depositing fluoropolymer.

5. The method defined in claim 4 wherein depositing the fluoropolymer comprises evaporating perfluoropolyether.

6. The method defined in claim 5 wherein depositing the silicon oxide layer comprises depositing the silicon oxide layer by evaporation and wherein depositing the layer of sodium fluoride comprises depositing the layer of sodium fluoride by evaporation.

7. The method defined in claim 5 wherein the curing comprises exposure of the oleophobic material to moisture.

8. The method defined in claim 7 wherein the curing comprises exposure of the oleophobic material to a temperature of at least 100° C. to form Si—O—Si chemical bonds.

9. The method defined in claim 8 further comprising spraying the oleophobic material with water to remove sodium.

10. A method of forming an oleophobic coating on a transparent protective layer for an electronic device, comprising:
cleaning the transparent protective layer;
evaporating a layer of silicon oxide onto a surface of the cleaned transparent protective layer;
evaporating a catalyst layer onto the layer of silicon oxide; and
depositing fluoropolymer onto the catalyst layer.

11. The method defined in claim 10 wherein evaporating the catalyst layer comprises evaporating a sodium fluoride catalyst layer onto the layer of silicon oxide.

12. The method defined in claim 11 wherein depositing the fluoropolymer comprises evaporating perfluoropolyether onto the catalyst layer.

13. The method defined in claim 12 further comprising curing the deposited fluoropolymer in the presence of the sodium fluoride catalyst layer to chemically bond the oleophobic coating to the transparent protective layer.

14. The method defined in claim 13 wherein the fluoropolymer comprises a silane coupling group.

\* \* \* \* \*